(12) United States Patent  
O'Dwyer et al.

(10) Patent No.: US 8,040,153 B1
(45) Date of Patent: Oct. 18, 2011

(54) METHOD AND APPARATUS FOR CONFIGURING THE INTERNAL MEMORY CELLS OF AN INTEGRATED CIRCUIT

(75) Inventors: John G. O'Dwyer, Maynooth (IE); Patrick J. Crotty, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 12/694,169

(22) Filed: Jan. 26, 2010

Related U.S. Application Data

(60) Provisional application No. 61/148,929, filed on Jan. 31, 2009.

(51) Int. Cl.
*H03K 19/177* (2006.01)
(52) U.S. Cl. ............................................. 326/39; 326/41
(58) Field of Classification Search .............. 326/37–41, 326/47, 101, 16
See application file for complete search history.

(56) References Cited

U.S. PATENT DOCUMENTS

| | | | | |
|---|---|---|---|---|
| 5,825,202 | A * | 10/1998 | Tavana et al. ..................... | 326/39 |
| 6,518,787 | B1 * | 2/2003 | Allegrucci et al. .............. | 326/38 |
| 6,864,710 | B1 * | 3/2005 | Lacey et al. ...................... | 326/39 |
| 6,983,441 | B2 * | 1/2006 | Wescott ........................... | 716/117 |

OTHER PUBLICATIONS

U.S. Appl. No. 61/148,929, filed Jan. 31, 2009, O'Dwyer et al.
U.S. Appl. No. 12/693,643, filed Jan. 26, 2010, O'Dwyer.
U.S. Appl. No. 12/693,648, filed Jan. 26, 2010, O'Dwyer et al.
Xilinx, Inc., "Dynamic Phase Alignment with ChipSync Technology in Virtex-4 FPGAs," *Xcell Journal*, Apr. 2005, pp. 72-74, Issue 52, Xilinx, Inc., San Jose, California, USA.
Xilinx, Inc., *16-Channel, DDR LVDS Interface with Real-Time Window Monitoring*, App. Note XAPP860 (v1.1), Jul. 17, 2008, pp. 1-43, Xilinx, Inc., San Jose, California, USA.

* cited by examiner

*Primary Examiner* — James H Cho
(74) *Attorney, Agent, or Firm* — Kin-Wah Tong

(57) ABSTRACT

In one embodiment, a method and apparatus for configuring the internal memory cells of an integrated circuit through the logic fabric are disclosed. For example, an integrated circuit according to one embodiment includes a logic fabric and a plurality of input/output blocks coupled to the logic fabric, wherein the plurality of input/output blocks is positioned around the periphery of the logic fabric. The plurality of input/output blocks therefore forms a ring around the logic fabric, wherein a data path and a clock path are formed along the periphery of the logic fabric through the plurality of input/output blocks.

19 Claims, 6 Drawing Sheets

METHOD AND APPARATUS FOR CONFIGURING THE INTERNAL MEMORY CELLS OF AN INTEGRATED CIRCUIT

CROSS REFERENCE TO RELATED APPLICATIONS

This application claims the benefit of U.S. Provisional Patent Application Ser. No. 61/148,929, filed Jan. 31, 2009, which is herein incorporated by reference in its entirety.

FIELD OF THE INVENTION

This invention relates generally to a method and apparatus for configuring the internal memory cells of an integrated circuit (IC) through the logic fabric.

SUMMARY

In one embodiment, a method and apparatus for configuring the internal memory cells of an integrated circuit through the logic fabric are disclosed. For example, an integrated circuit according to one embodiment includes a logic fabric and a plurality of input/output blocks coupled to the logic fabric, where the plurality of input/output blocks forms a ring around a periphery of the logic fabric, wherein a data path and a first clock path are formed along the periphery of the logic fabric through the plurality of input/output blocks.

In another embodiment, a method for configuring internal memory cells of an integrated circuit includes: receiving, at a first shift register of an Input/Output block in the integrated circuit, a clock signal output from a previous shift register; receiving, at the first shift register, a data signal output from the previous shift register, after receiving the clock signal; outputting, by the first shift register, the clock signal to a next shift register; and changing data on an output data path of the first shift register, after outputting the clock signal.

In yet another embodiment, a method for configuring internal memory cells of an integrated circuit includes: generating a clock signal in a logic fabric of the integrated circuit; generating a data signal in the logic fabric comprising configuration data for the internal memory cells; and scanning the clock signal and the data signal through the internal memory cells. The internal memory cells form a ring around a periphery of the logic fabric, wherein a data path and a first clock path are formed along the periphery of the logic fabric through the internal memory cells.

BRIEF DESCRIPTION OF THE DRAWINGS

Accompanying drawings show exemplary embodiments in accordance with one or more aspects of the invention; however, the accompanying drawings should not be taken to limit the invention to the embodiments shown, but are for explanation and understanding only.

DETAILED DESCRIPTION

In one embodiment, the present invention relates generally to a method and apparatus for configuring the internal memory cells of an integrated circuit (IC) through the logic fabric, e.g., via a dynamic reconfiguration port (DRP). Embodiments of the invention scan configuration data around the periphery of an IC chip. Thus, shift registers are configured as an input/output block (IOB) ring that allows data to be read and written at high speed (e.g., sixteen bits at approximately 100 to 200 MHz). Embodiments of the invention may be advantageously implemented in IC devices including programmable logic devices (PLDs), such as field programmable gate arrays (FPGAs).

Figure 1:
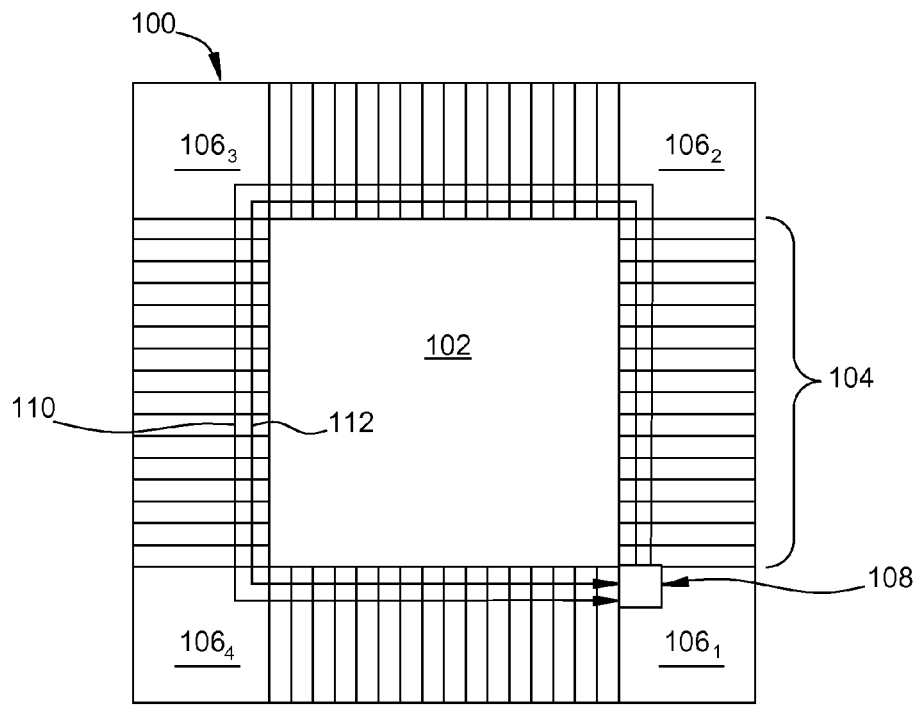
FIG. 1 is a schematic diagram illustrating one embodiment of an IC chip (die), according to the present invention.

FIG. 1 is a schematic diagram illustrating one embodiment of an IC chip 100, according to the present invention. The IC chip 100 may comprise, for example, a programmable logic device (PLD), such as a field programmable gate array (FPGA) or the like.

As illustrated, the IC chip 100 comprises a logic fabric 102 and a plurality of input/output blocks (IOBs) 104 (broadly internal memory cells) coupled to the logic fabric 102 and positioned around the periphery of the logic fabric 102, such that the IOBs 104 form a ring. In one embodiment, the IOBs 104 are grouped in registers that are sixteen bits wide. One of the corners $106_1$-$106_4$ (hereinafter collectively referred to as "corners 106") of the periphery includes a configuration state machine 108. In the illustrated embodiment, the configuration state machine 108 is positioned at a first corner $106_1$.

In one embodiment, a data path 110 and a clock path 112 both travel in the same direction (e.g., counter-clockwise) around the ring of IOBs 104, originating at the configuration state machine 108. The data path 110 carries a data signal d (e.g., configuration data for the IOBs 104), while the clock path 112 carries an input clock signal ci. In one embodiment, the clock signal ci is approximately 100 to 200 MHz, while the data signal d comprises sixteen bits of data.

Figure 2:
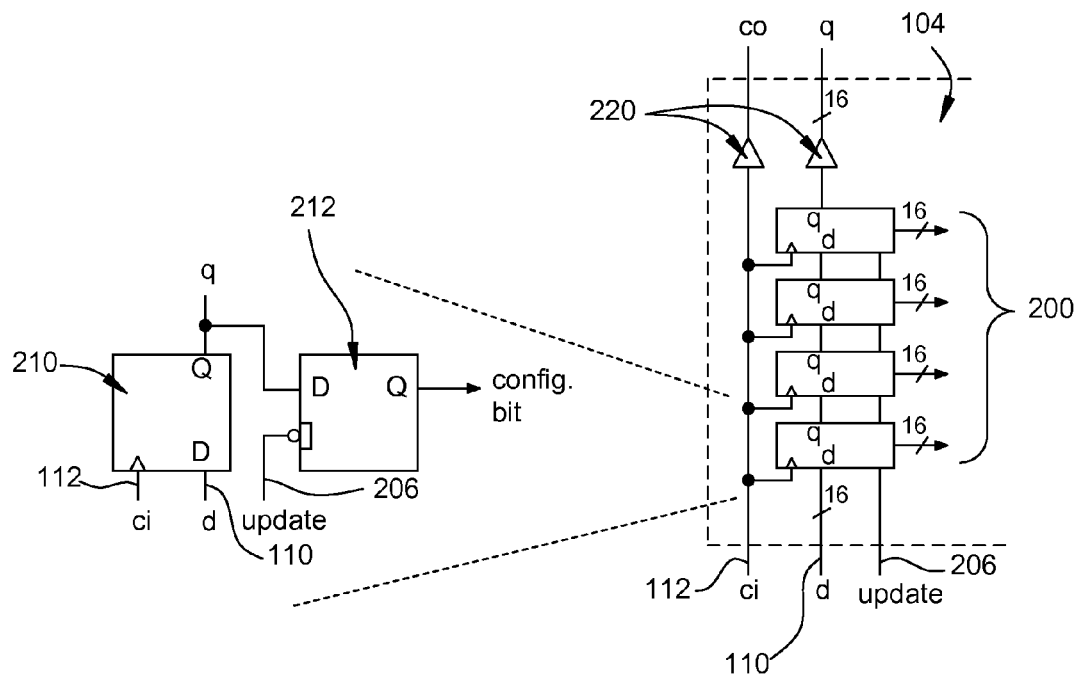
FIG. 2 is a schematic diagram illustrating one embodiment of an input/output block, according to the present invention.

FIG. 2 is a schematic diagram illustrating one embodiment of an IOB 104, according to the present invention. In one embodiment, all of the IOBs 104 illustrated in FIG. 1 are configured as illustrated in FIG. 2. As illustrated, the IOB 104 comprises n sets of shift registers 200. In the illustrated embodiment, the IOB 104 comprises four sets of shift registers 200.

As also illustrated, each bit in the shift register 200 comprises a flip flop 210 coupled to a shadow latch 212. Each of the shift registers 200 receives the data signal d on a first input coupled to the data path 110, the input clock signal ci on a second input coupled to the clock path 112, and a global update signal on third input coupled to an update path 206. In one embodiment, the first and second inputs enter the flip flop 210, while the third input enters the shadow latch 212.

The flip flops 210 of the shift registers 200 output the data signal q (on the data path 110). In particular, at each flip flop 210, the data signal is output to the next shift register 200 in the ring of IOBs 104. In addition, the shadow latches 212 output a configuration bit.

In one embodiment, one or more optional buffers 220 are placed outside the IOB 104. These buffers 220 may be placed in the data path 110 only or in both the data path 110 and the clock path 112. The buffers 220 may be placed outside of each IOB 104, or they may be placed outside every few IOBs 104 (e.g., at selected intervals, to re-buffer the clock signal ci).

In operation, a configuration frame is first scanned around the ring of IOBs 104 through the flip flops 210. When the entire frame has been written, the shadow latches 212 are updated together with the global update signal 206. The clock signal ci essentially races ahead of the flip flop output q, so that the clock signal co reaches the next flip flop 210 in a set of shift registers 200 before the input data d changes. This achieves high operating speeds (e.g., sixteen bits at approximately 100 to 200 MHz), where the speed of operation is independent of the size of the ring of IOBs 104. The limiting factor is the longest relative delay between the clock signal ci and the data signal d between any two consecutive shift registers 200.

Figure 3:
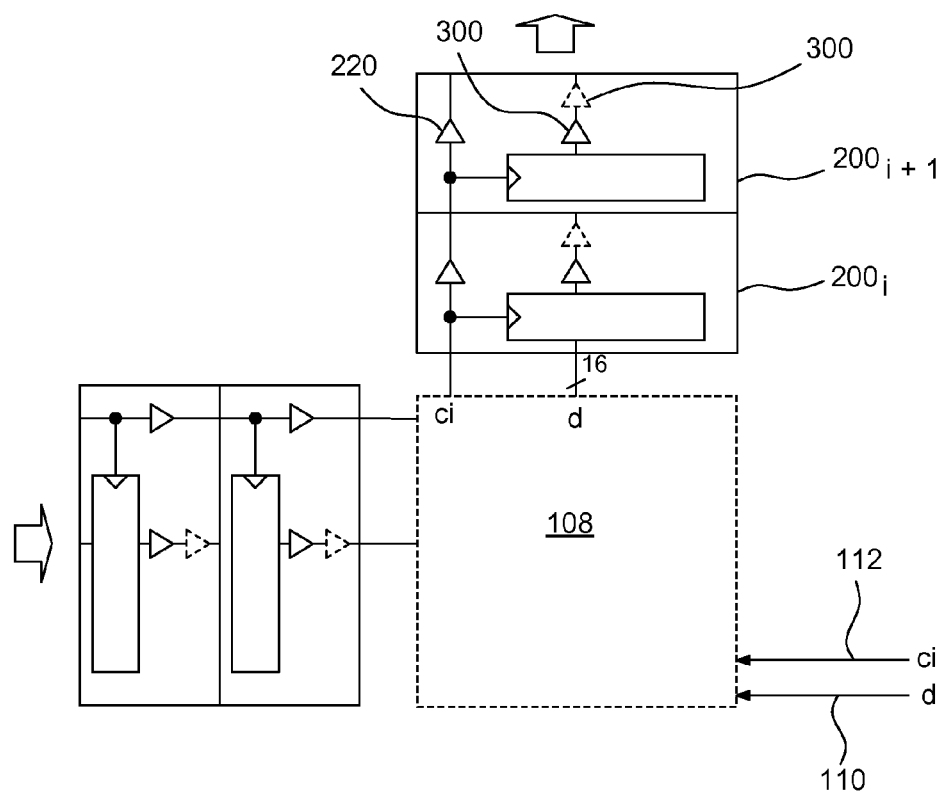
FIG. 3 is a schematic diagram illustrating one embodiment of a configuration for writing configuration data, according to the present invention.

In one embodiment, reading and writing are performed differently using the IC chip 100. FIG. 3, for example, is a schematic diagram illustrating one embodiment of a configuration for writing configuration data, according to the present invention. As illustrated, the data signal d and the input clock signal ci are input into the same end of the shift register $200_i$. An optional delay is then added to the path taken by the data signal d by inserting one or more buffers 300 in each shift register 200, along the data path 110. Alternatively, the buffer(s) 300 could be placed in the data path 110, but external to the shift register 200. As a result, each shift register 200 will receive the clock signal ci before the data signal d from the previous shift register 200. The buffers 300 may be used with or without the buffers 220 discussed above. For example, the buffers 300 may be used if the next IOB 104 in the ring is not abutted (e.g., is around a corner), and the data and clock signals have to travel a significant distance to reach the next IOB 104. In one embodiment, zero or more buffers may also be placed in the clock path 112 to delay the clock signal ci. In such a case, a greater number of buffers will be placed in the data path 110 than is placed in the clock path 112, in order to ensure that the data signal d is delayed by a greater amount than the clock signal ci.

Figure 4:
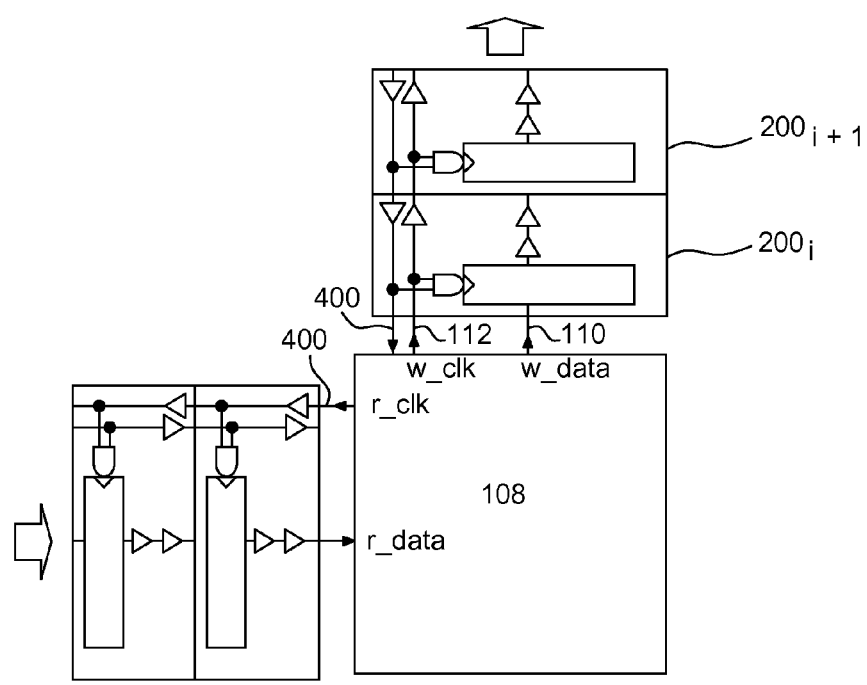
FIG. 4 is a schematic diagram illustrating one embodiment of a configuration for reading configuration data, according to the present invention.

FIG. 4 is a schematic diagram illustrating one embodiment of a configuration for reading configuration data, according to the present invention. The configuration is similar to that illustrated in FIG. 3, except that a second clock path 400 for a read clock signal r_clk is added. The second clock path 400 for the read clock signal r_clk, is routed around the ring of IOBs 104 and travels in a direction opposite to the clock path 112 taken by a write clock signal w_clk. This allows the data signal r_data (from the last IOB 104 in the ring) on the data path 110 to be read back at a frequency that is independent of the length of the ring of IOBs 104. The limiting factor is again the longest relative delay between the read clock signal r_clk and the data signal r_data between any two consecutive shift registers 200.

One advantage of using a shift register type structure for the ring of IOBs 104 is that it allows any arbitrary section of the ring of IOBs 104 to be independently controlled via an alternative path. Thus, each IOB 104 can be independently configured via a DRP port.

Figure 5:
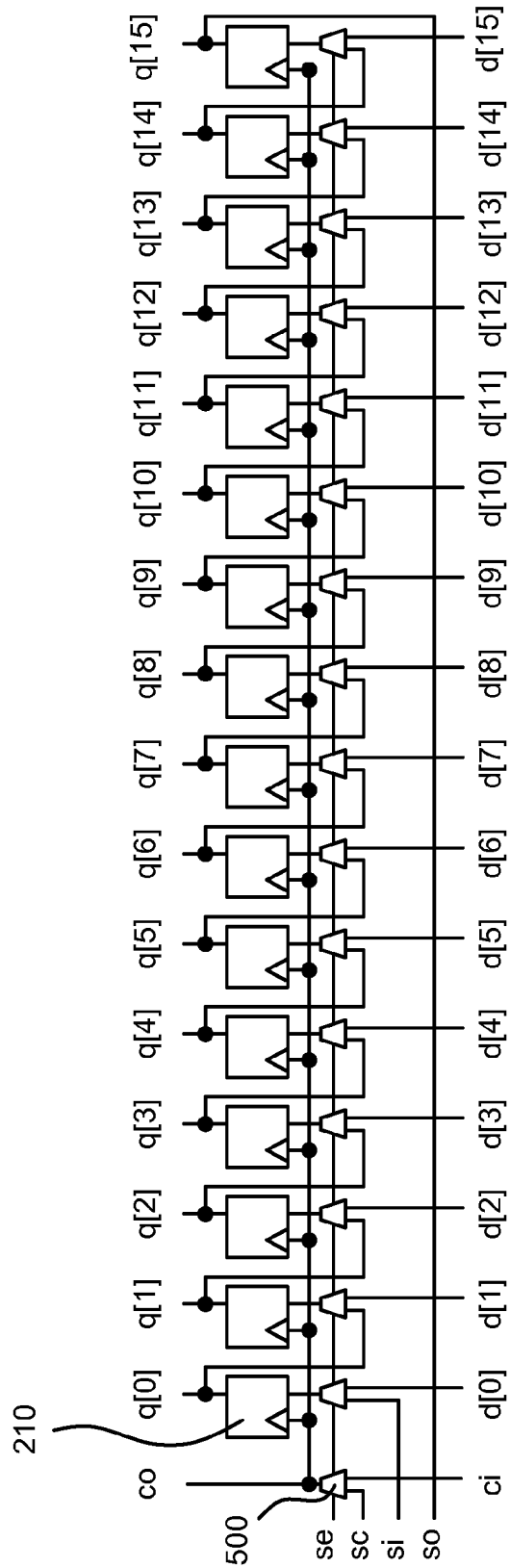
FIG. 5 is a schematic diagram illustrating one embodiment of a configuration that allows the input/output blocks to be independently configured, according to the present invention.

FIG. 5, for example, is a schematic diagram illustrating one embodiment of a configuration that allows the IOBs 104 to be independently configured, according to the present invention. As illustrated, a multiplexer 500 is positioned at the first data input (D) of each flip flop 210. In addition, a second data input (scan input or SI) for the flip flop 210 is connected to an alternative path. The path of the clock signal is configured such that only select flip flops 210 are driven by an alternative clock signal (scan enable or SC). When the configuration state machine 108 is not using the IOB configuration shift register (i.e., the ring of IOBs 104), the scan enable (SE) input of the flip flop 210 can be enabled, thereby allowing the use of the alternative path for reconfiguration. In one embodiment, the signals on the scan input (SI) and scan enable (SC and SE) inputs come from the logic fabric 102.

Figure 6:
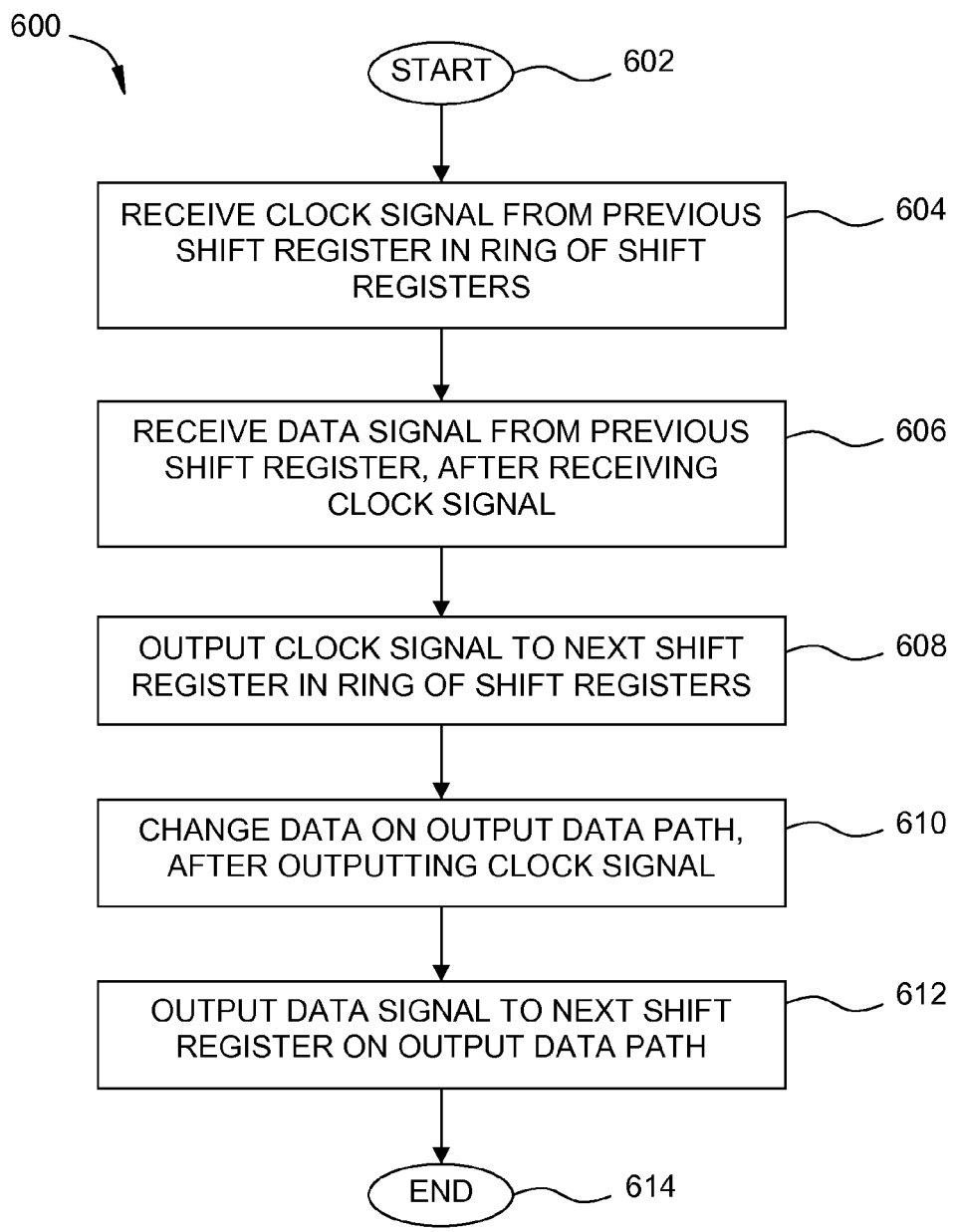
FIG. 6 is a flow diagram illustrating one embodiment of a method for configuring the internal memory cells of an integrated circuit, according to the present invention.

FIG. 6 is a flow diagram illustrating one embodiment of a method 600 for configuring the internal memory cells of an integrated circuit, according to the present invention. The method 600 may be implemented, for example, by a shift register such as the shift registers 200 illustrated in the previous figures. As such, discussion of the method 600 makes reference to various elements illustrated in FIGS. 1-5. However, it will be appreciated that the method 600 may also be implemented in ICs having configurations that deviate from the configuration illustrated in FIGS. 1-5.

The method 600 is initialized at step 602. In step 604, the shift register 200, receives a clock signal from a previous shift register $200_{i-1}$ in a ring of shift registers 200. Then, in step 606, the shift register 200, receives a data signal from the previous shift register $200_{i-1}$, after receiving the clock signal. Thus arrival of the data signal is delayed with respect to the arrival of the clock signal.

In step 608, the shift register 200, outputs the clock signal to the next shift register $200_{i+1}$ in the ring of shift registers 200. After outputting the clock signal, the shift register $200_i$ changes the data on its output data path in step 610. The shift register $200_i$ then outputs the data signal to the next shift register $200_{i+1}$ on its output data path in step 612. The method 600 then terminates in step 614.

Figure 7:
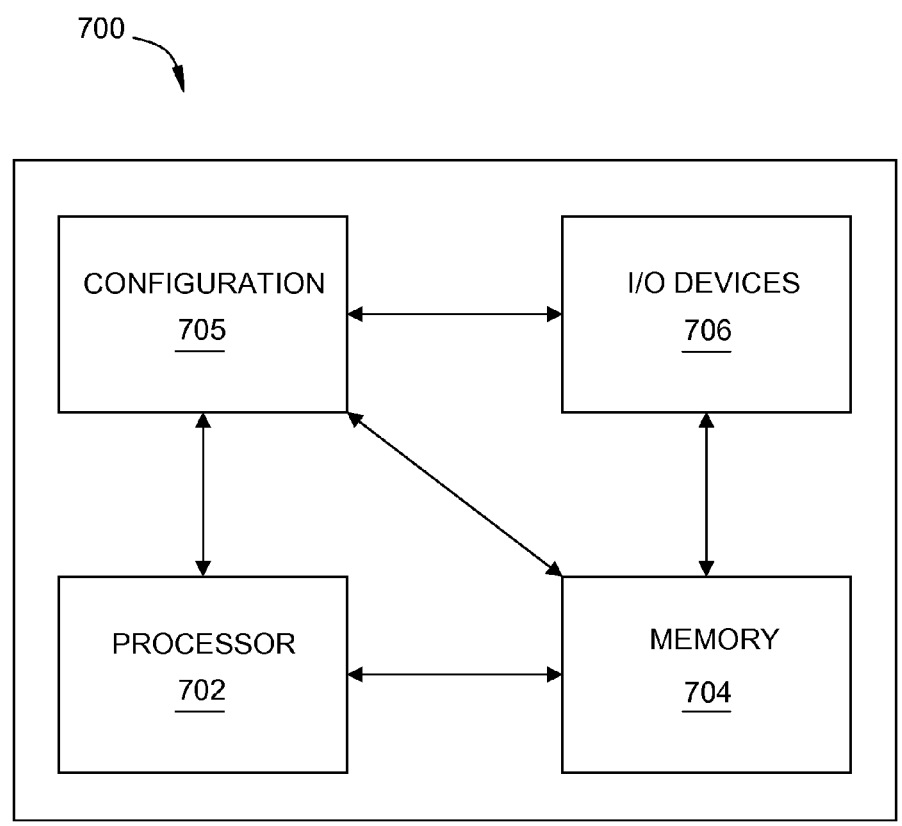
FIG. 7 depicts a high level block diagram of a general purpose computer or a computing device suitable for use in performing some or all of the functions described herein.

FIG. 7 depicts a high level block diagram of a general purpose computer or a computing device suitable for use in performing some or all of the functions described herein. As depicted in FIG. 7, the system 700 comprises a processor element or processing elements 702 (e.g., a central processing unit (CPU)), a memory 704 (e.g., a random access memory (RAM) and/or a read only memory (ROM)), a configuration module 705 for configuring the internal memory cells of an integrated circuit, and various input/output devices 706 (e.g., storage devices, including but not limited to, a memory device, a tape drive, a floppy drive, a hard disk drive or a compact disk drive, a receiver, a transmitter, a speaker, a display, a speech synthesizer, an output port, and a user input device (such as a keyboard, a keypad, a mouse, and the like)).

Embodiments of the present invention can be implemented in software and/or in a combination of software and hardware (e.g., using application specific integrated circuits (ASIC), a general purpose computer, one or more portions of a PLD, or any other hardware equivalents such as microprocessors). In one embodiment, one or more steps the present module or process for configuring the internal memory cells of an integrated circuit may be loaded into memory 704 and executed by processor 702 to implement the functions as discussed above. As such, the present module or process 705 for configuring the internal memory cells of an integrated circuit of embodiments of the present invention can be stored on a non-transitory computer readable storage medium (e.g., RAM memory, magnetic or optical drive or diskette and the like).

It should be noted that although not explicitly specified, one or more steps of the methods described herein may include a storing, displaying and/or outputting step as required for a particular application. In other words, any data, records, fields, and/or intermediate results discussed in the methods can be stored, displayed, and/or outputted to another device as required for a particular application. Furthermore, steps or blocks in the accompanying Figures that recite a determining operation or involve a decision, do not necessarily require that both branches of the determining operation be practiced. In other words, one of the branches of the determining operation can be deemed as an optional step.

While the foregoing describes exemplary embodiments in accordance with one or more aspects of the present invention, other and further embodiments in accordance with the one or more aspects of the present invention may be devised without departing from the scope thereof, which is determined by the claims that follow and equivalents thereof. Claims listing steps do not imply any order of the steps. Trademarks are the property of their respective owners.

What is claimed is:

1. An integrated circuit, comprising:
a logic fabric; and
a plurality of input/output blocks coupled to the logic fabric,
wherein the plurality of input/output blocks forms a ring around a periphery of the logic fabric,
wherein a data path and a first clock path are formed along the periphery of the logic fabric through the plurality of input/output blocks,
wherein a second clock path is formed along the periphery of the logic fabric through the plurality of input/output blocks, and
wherein the first clock path carries a write clock signal and the second clock path carries a read clock signal.

2. The integrated circuit of claim 1, wherein the write clock signal and the read clock signal travel in opposite direction.

3. The integrated circuit of claim 1, wherein each of the plurality of input/output blocks comprises:
a plurality of shift registers.

4. The integrated circuit of claim 3, wherein:
a first input of each of the plurality of shift registers is coupled to the data path that carries a data signal, and
a second input of each of the plurality of shift registers is coupled to the first clock path that carries a clock signal.

5. The integrated circuit of claim 4, wherein the first clock path and the data path travel in a same direction around the periphery of the logic fabric.

6. The integrated circuit of claim 4, wherein the first clock path and the data path originate at a configuration state machine.

7. The integrated circuit of claim 4, wherein the data signal comprises configuration data for the plurality of input/output blocks.

8. The integrated circuit of claim 4, further comprising:
at least one buffer placed in the data path within at least one of the plurality of shift registers.

9. The integrated circuit of claim 4, further comprising:
at least one buffer placed in the first clock path within at least one of the plurality of shift registers.

10. The integrated circuit of claim 1, wherein the integrated circuit comprises a programmable logic device (PLD).

11. The integrated circuit of claim 1, wherein each of the plurality of input/output blocks comprises:
a multiplexer for allowing each of the plurality of input/output blocks to be independently configured.

12. A method for configuring internal memory cells of an integrated circuit, the method comprising:
receiving, at a first shift register of an Input/Output block in the integrated circuit, a clock signal output from a previous shift register;
receiving, at the first shift register, a data signal output from the previous shift register, after receiving the clock signal;
outputting, by the first shift register, the clock signal to a next shift register; and
changing data on an output data path of the first shift register, after outputting the clock signal.

13. The method of claim 12, further comprising:
outputting, by the first shift register, the data signal on the output data path to the next shift register.

14. The method of claim 12, wherein the first shift register, the previous shift register, and the next shift register are part of one or more Input/Output blocks positioned in a ring around a periphery of a logic fabric of the integrated circuit.

15. The method of claim 12, wherein the data signal comprises configuration data for the first shift register, the previous shift register, and the next shift register.

16. The method of claim 12, wherein the integrated circuit comprises a programmable logic device (PLD).

17. A method for configuring internal memory cells of an integrated circuit, the method comprising:
generating a clock signal in a logic fabric of the integrated circuit;
generating a data signal in the logic fabric comprising configuration data for the internal memory cells; and
scanning the clock signal and the data signal through the internal memory cells,
wherein the internal memory cells form a ring around a periphery of the logic fabric, and
wherein a data path and a first clock path are formed along the periphery of the logic fabric through the internal memory cells.

18. The method of claim 17, further comprising:
imposing a delay on the data signal such that the clock signal arrives at each of the internal memory cells ahead of the data signal.

19. An integrated circuit, comprising:
a logic fabric; and
a plurality of input/output blocks coupled to the logic fabric, wherein each of the plurality of input/output blocks comprises:
a plurality of shift registers, wherein:
a first input of each of the plurality of shift registers is coupled to a data path that carries a data signal, and
a second input of each of the plurality of shift registers is coupled to a first clock path that carries a clock signal,
wherein the plurality of input/output blocks forms a ring around a periphery of the logic fabric,
wherein the data path and the first clock path are formed along the periphery of the logic fabric through the plurality of input/output blocks, and
wherein the first clock path and the data path originate at a configuration state machine.

* * * * *